US012681075B2

(12) United States Patent
Owczarczyk et al.

(10) Patent No.: US 12,681,075 B2
(45) Date of Patent: Jul. 14, 2026

(54) CONFIGURING A FAULT-SENSING RING OSCILLATOR CIRCUIT

(71) Applicant: INTERNATIONAL BUSINESS MACHINES CORPORATION, Armonk, NY (US)

(72) Inventors: Pawel Owczarczyk, Highland, NY (US); Mark Cichanowski, Hutto, TX (US); Michael Greene, Austin, TX (US); Michael Romain, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 18/193,587

(22) Filed: Mar. 30, 2023

(65) Prior Publication Data

US 2024/0329115 A1    Oct. 3, 2024

(51) Int. Cl.
| | |
|---|---|
| *G01R 31/28* | (2006.01) |
| *G01R 31/3187* | (2006.01) |
| *G01R 31/3193* | (2006.01) |
| *H03K 3/03* | (2006.01) |

(52) U.S. Cl.
CPC ..... *G01R 31/2851* (2013.01); *G01R 31/3187* (2013.01); *G01R 31/3193* (2013.01); *H03K 3/0315* (2013.01)

(58) Field of Classification Search
CPC ...... H03K 3/0315; H03K 3/0322; H03K 3/03; G01R 31/2851; G01R 31/3193; G01R 31/31937; G01R 31/3181; G01R 31/3187; G01R 31/28
See application file for complete search history.

(56) References Cited

U.S. PATENT DOCUMENTS

| | | | |
|---|---|---|---|
| 8,841,974 B2 | 9/2014 | Sul et al. | |
| 9,205,934 B2 | 12/2015 | Rashkov et al. | |
| 9,217,769 B2 | 12/2015 | Ding et al. | |
| 9,983,262 B1 * | 5/2018 | Trock | G01R 31/31853 |
| 10,276,257 B2 | 4/2019 | Han | |

(Continued)

FOREIGN PATENT DOCUMENTS

WO    WO-2016182676 A1 * 11/2016 ............. H03K 3/012

OTHER PUBLICATIONS

Delvaux et al., Fault Injection Modeling Attacks on 65nm Arbiter and RO Sum PUFs via Environmental Changes, Circuits and Systems I: Regular Papers, IEEE Transactions on 61(6):1701-1713, DOI:10.1109/TCSI.2013.2290845, dated Jun. 2014, 13 pages.
Giechaskiel et al., Measuring Long Wire Leakage with Ring Oscillators in Cloud FPGAs, Conference: 2019 29th International Conference on Field Programmable Logic and Applications (FPL), DOI:10.1109/FPL.2019.00017, dated Sep. 2019, 6 pages.

(Continued)

*Primary Examiner* — Ryan Johnson
(74) *Attorney, Agent, or Firm* — Stosch Sabo

(57)    ABSTRACT

Configuring a fault-sensing ring oscillator circuit is disclosed. In a particular embodiment, a fault-sensing ring oscillator circuit includes a plurality of ring oscillators; an enable circuit configured to enable and disable the plurality of ring oscillators; an OR circuit including a plurality of inputs, wherein each input is coupled to a respective ring oscillator of the plurality of ring oscillators; and a first fault detection latch including a SET input coupled to a first output of the OR circuit and a RESET input coupled to the enable circuit, wherein the first fault detection latch indicates a stuck at fault condition when the plurality of ring oscillators are disabled by the enable circuit and at least one of the plurality of ring oscillators is active.

20 Claims, 9 Drawing Sheets

(56) References Cited

U.S. PATENT DOCUMENTS

| | | | |
|---|---|---|---|
| 10,444,279 | B2 | 10/2019 | Chakrabarty et al. |
| 10,469,060 | B1 | 11/2019 | Hars |
| 10,680,587 | B2 | 6/2020 | Narwal et al. |
| 2008/0094053 | A1 | 4/2008 | Han et al. |
| 2011/0241725 | A1* | 10/2011 | Ikenaga ........... H03K 19/00392 |
| | | | 326/16 |
| 2014/0191813 | A1* | 7/2014 | Sul ............................ G06F 7/58 |
| | | | 331/46 |
| 2016/0218671 | A1 | 7/2016 | Jun et al. |
| 2021/0058075 | A1 | 2/2021 | Shah et al. |
| 2021/0211120 | A1 | 7/2021 | Gailhard |
| 2022/0048525 | A1 | 2/2022 | Tsai et al. |

OTHER PUBLICATIONS

Giechaskiel et al., Reading Between the Dies: Cross-SLR Covert Channels on Multi-Tenant Cloud FPGAs, Conference: 2019 IEEE 37th International Conference on Computer Design (ICCD), DOI:10. 1109/ICCD46524.2019.00010, dated Nov. 2019, 10 pages.
Salem et al., Fault-tolerant delay cell for ring oscillator application in 65 nm CMOS technology, IET Journals, The Institution of Engineering and Technology, IEF Circuits, Devices & Systems, vol. 12, Issue 3, DOI: 10.1049/iet-cds.2017.0380, Received on Sep. 2, 2017, Revised Oct. 31, 2017, Accepted on Nov. 19, 2017, E-First on Jan. 22, 2018, Published May 3, 2018, 9 pages.
Yao et al., Programmable Ring Oscillator (PRO): A Multipurpose Design for On-chip Side-channel Countermeasure and Fault Detection, URL: https://eprint.iacr.org/2021/878.pdf, arXiv:2106. 13784v1 [cs.CR], dated Jun. 25, 2021, 13 pages.

* cited by examiner

Fault-Sensing Ring Oscillator Circuit 500

FIG. 5B

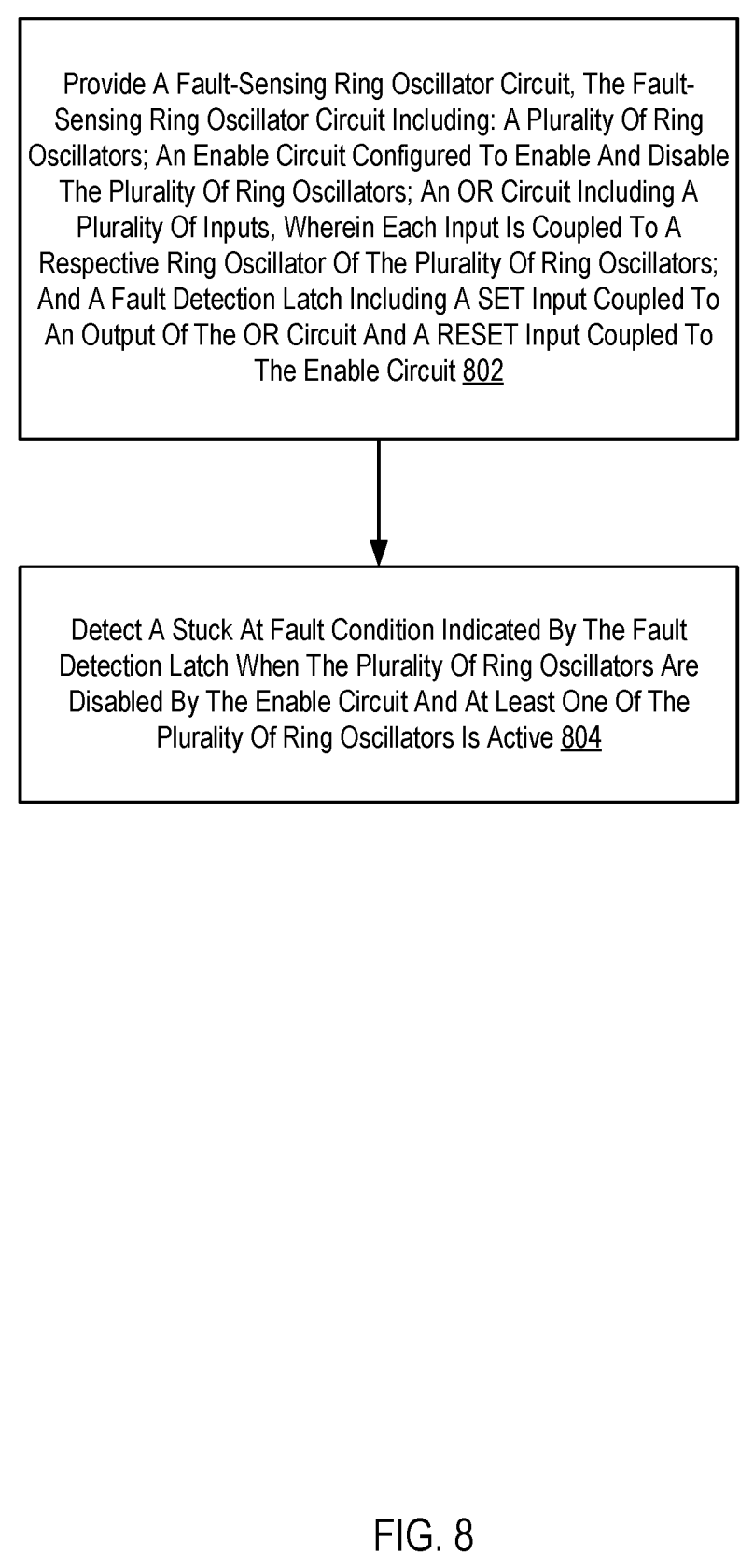

Provide A Fault-Sensing Ring Oscillator Circuit, The Fault-Sensing Ring Oscillator Circuit Including: A Plurality Of Ring Oscillators; An Enable Circuit Configured To Enable And Disable The Plurality Of Ring Oscillators; An OR Circuit Including A Plurality Of Inputs, Wherein Each Input Is Coupled To A Respective Ring Oscillator Of The Plurality Of Ring Oscillators; And A Fault Detection Latch Including A SET Input Coupled To An Output Of The OR Circuit And A RESET Input Coupled To The Enable Circuit 802

Detect A Stuck At Fault Condition Indicated By The Fault Detection Latch When The Plurality Of Ring Oscillators Are Disabled By The Enable Circuit And At Least One Of The Plurality Of Ring Oscillators Is Active 804

FIG. 8

CONFIGURING A FAULT-SENSING RING OSCILLATOR CIRCUIT

BACKGROUND

Field of the Disclosure

The field of the disclosure is fault detection, or, more specifically, methods, apparatus, and products for fault-sensing ring oscillator circuit.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Ring oscillators have a wide array of applications in semiconductor circuits. For example, ring oscillators may be employed in voltage controlled oscillators, random number generators, integrated circuit fabrication and characterization, semiconductor device debugging, memory device characterization, cryptography, frequency selection, and so on. A particular semiconductor circuit may include a large number of ring oscillators. However, ring oscillators can use a large amount of current, and thus a ring oscillator that is stuck at fault (i.e., active when it should be disabled) can greatly affect the power characterization of a device. Given a large number of ring oscillators, it is difficult to test each ring oscillator to determine if one is stuck.

SUMMARY

Embodiments in accordance with the present disclosure are directed to apparatuses, methods, and systems for configuring a fault-sensing ring oscillator circuit. In a particular embodiment, a fault-sensing ring oscillator circuit includes a plurality of ring oscillators. The fault-sensing ring oscillator circuit also includes an enable circuit configured to enable and disable the plurality of ring oscillators. The fault-sensing ring oscillator circuit also includes an OR circuit including a plurality of inputs, where each input is coupled to a respective ring oscillator of the plurality of ring oscillators. The fault-sensing ring oscillator circuit also includes a fault detection latch including a SET input coupled to an output of the OR circuit and a RESET input coupled to the enable circuit. The fault detection latch indicates a stuck at fault condition when the plurality of ring oscillators are disabled by the enable circuit and at least one of the plurality of ring oscillators is active.

The foregoing and other objects, features and advantages of the disclosure will be apparent from the following more particular descriptions of exemplary embodiments of the disclosure as illustrated in the accompanying drawings wherein like reference numbers generally represent like parts of exemplary embodiments of the disclosure.

BRIEF DESCRIPTION OF THE DRAWINGS

FIG. 5B shows another example operation of a fault-sensing ring oscillator circuit according to some embodiments of the present disclosure.

FIG. 8 is a flowchart of an example method for a fault-sensing ring oscillator circuit according to some embodiments of the present disclosure.

DETAILED DESCRIPTION

Figure 1:
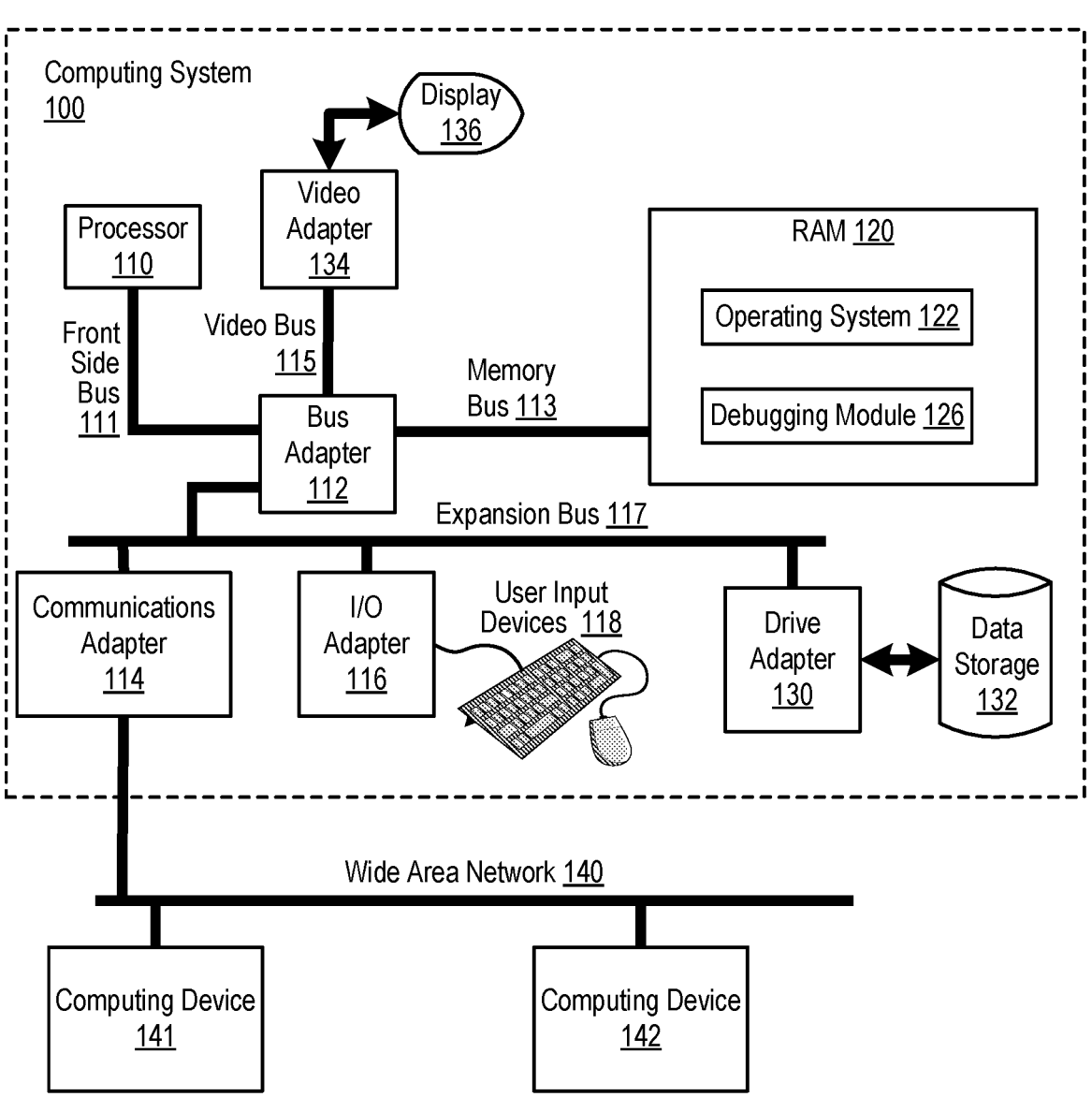
FIG. 1 a block diagram of an example computing system configured for fault-sensing ring oscillator circuit in accordance with embodiments of the present disclosure.

When working with large number of ring oscillators, it is not feasible to test each such element with a scope. Embodiments in accordance with the present disclosure provide techniques that are used to quickly detect a stuck at fault condition in one or more ring oscillators. In one example, the outputs of 1 to N ring oscillators are connected into an N:1 OR tree. The resulting signal is used as the SET of a Set-Reset latch. A ring oscillator enable is used as the RESET. Once the oscillator enable goes away, if any ring oscillators are still active (oscillating) the output will be switching and will SET the latch, thus indicating a stuck condition. A higher resolution of the circuit can be achieved by having multiple Set-Reset latches checking smaller subsets of ring oscillators.

A particular embodiment is directed to a fault-sensing ring oscillator circuit. The fault-sensing ring oscillator circuit includes a plurality of ring oscillators. The fault-sensing ring oscillator circuit also includes an enable circuit configured to enable and disable the plurality of ring oscillators. The fault-sensing ring oscillator circuit also includes an OR circuit including a plurality of inputs, where each input is coupled to a respective ring oscillator of the plurality of ring oscillators. The fault-sensing ring oscillator circuit also includes a first fault detection latch including a SET input coupled to a first output of the OR circuit and a RESET input coupled to the enable circuit. The first fault detection latch indicates a stuck at fault condition when the plurality of ring oscillators are disabled by the enable circuit and at least one of the plurality of ring oscillators is active.

In some examples, the first output of the OR circuit indicates logical 1 when at least one of the plurality of ring oscillators is active, and where the first fault detection latch is set by the first output of the OR circuit indicating logical 1. The first fault detection latch may output logical 1 when set, and a stuck at fault condition may be indicated when the first fault detection latch outputs logical 1. In some examples, the first fault detection latch is reset when the enable circuit disables the plurality of ring oscillators.

In some examples, the OR circuit includes a NOR-NAND tree coupled to the plurality of ring oscillators, the NOR-NAND tree including alternating stages of NOR gates and NAND gates, where a final stage of the NOR-NAND tree includes a single gate that provides the first output of the OR circuit.

In some examples, the OR circuit includes a NOR-NAND tree coupled to the plurality of ring oscillators, the NOR-NAND tree including alternating stages of NOR gates and NAND gates, where a final stage of the NOR-NAND tree includes at least two gates. A first gate of the at least two gates provides the first output of the OR circuit to indicate a fault in a first subset of the plurality of ring oscillators. A second gate of the at least two gates provides a second output of the OR circuit to indicate a fault in a second subset of the plurality of ring oscillators, and the second output of the OR circuit is coupled to a second fault detection latch. In some examples, the plurality of ring oscillators is coupled to a power controller, where the power controller includes the enable circuit.

Another embodiment is directed to an integrated circuit including a fault-sensing ring oscillator circuit. The integrated circuit includes a power controller. The integrated circuit also includes a plurality of ring oscillators, where the plurality of ring oscillators are enabled and disabled by an enable circuit of the power controller. The integrated circuit also includes an OR circuit including a plurality of inputs, wherein each input is coupled to a respective ring oscillator of the plurality of ring oscillators. The integrated circuit also includes a first fault detection latch including a SET input coupled to a first output of the OR circuit and a RESET input coupled to the enable circuit. The first fault detection latch indicates a stuck at fault condition when the plurality of ring oscillators are disabled by the enable circuit and at least one of the plurality of ring oscillators is active. In some examples, power controller enables the plurality of ring oscillators to reduce a maximum voltage of the processor.

Another embodiment is directed to a method of a fault-sensing ring oscillator circuit. The method includes providing a fault-sensing ring oscillator circuit, the fault-sensing ring oscillator circuit including: a plurality of ring oscillators; an enable circuit configured to enable and disable the plurality of ring oscillators; an OR circuit including a plurality of inputs, wherein each input is coupled to a respective ring oscillator of the plurality of ring oscillators; and a fault detection latch including a SET input coupled to an output of the OR circuit and a RESET input coupled to the enable circuit. The method also includes detecting a stuck at fault condition indicated by the fault detection latch when the plurality of ring oscillators are disabled by the enable circuit and at least one of the plurality of ring oscillators is active.

Exemplary apparatus and systems for fault-sensing ring oscillator circuit in accordance with the present disclosure are described with reference to the accompanying drawings, beginning with FIG. 1. FIG. 1 sets forth a block diagram of automated computing machinery comprising an exemplary computing system 100. The computing system 100 of FIG. 1 includes at least one computer processor 110 or 'CPU' as well as random access memory ('RAM') 120 which is connected through a high speed memory bus 113 and bus adapter 112 to processor 110 and to other components of the computing system 100.

Stored in RAM 120 is an operating system 122. Operating systems may include UNIX™, Linux™, Microsoft Windows™, AIX™, and others as will occur to those of skill in the art. The operating system 122 in the example of FIG. 1 is shown in RAM 120, but many components of such software typically are stored in non-volatile memory also, such as, for example, on data storage 132, such as a disk drive. In some examples, a debugging module 126 is stored in RAM 120. The debugging module may be a set of computing programming instructions that reads the output of a fault detection latch and generates an output indicating one or more ring oscillators is stuck at fault.

The computing system 100 of FIG. 1 includes disk drive adapter 130 coupled through expansion bus 117 and bus adapter 112 to processor 110 and other components of the computing system 100. Disk drive adapter 130 connects non-volatile data storage to the computing system 100 in the form of data storage 132. Disk drive adapters useful in computers configured for inserting sequence numbers into editable tables according to embodiments of the present disclosure include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system 100 of FIG. 1 includes one or more input/output ('I/O') adapters 116. I/O adapters implement user-oriented input/output through, for example, software drivers and computer hardware for controlling output to display devices such as computer display screens, as well as user input from user input devices 118 such as keyboards and mice. The example computing system 100 of FIG. 1 includes a video adapter 134, which is an example of an I/O adapter specially designed for graphic output to a display device 136 such as a display screen or computer monitor. Video adapter 134 is connected to processor 110 through a high speed video bus 115, bus adapter 112, and the front side bus 111, which is also a high speed bus.

The exemplary computing system 100 of FIG. 1 includes a communications adapter 114 for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for inserting sequence numbers into editable tables according to embodiments of the present disclosure include modems for wired dial-up communications, Ethernet (IEEE 802.3) adapters for wired data communications, and 802.11 adapters for wireless data communications. The communications adapter 114 of FIG. 1 is communicatively coupled to a wide area network 140 that also includes other computing devices, such as computing devices 141 and 142 as shown in FIG. 1.

Figure 2:
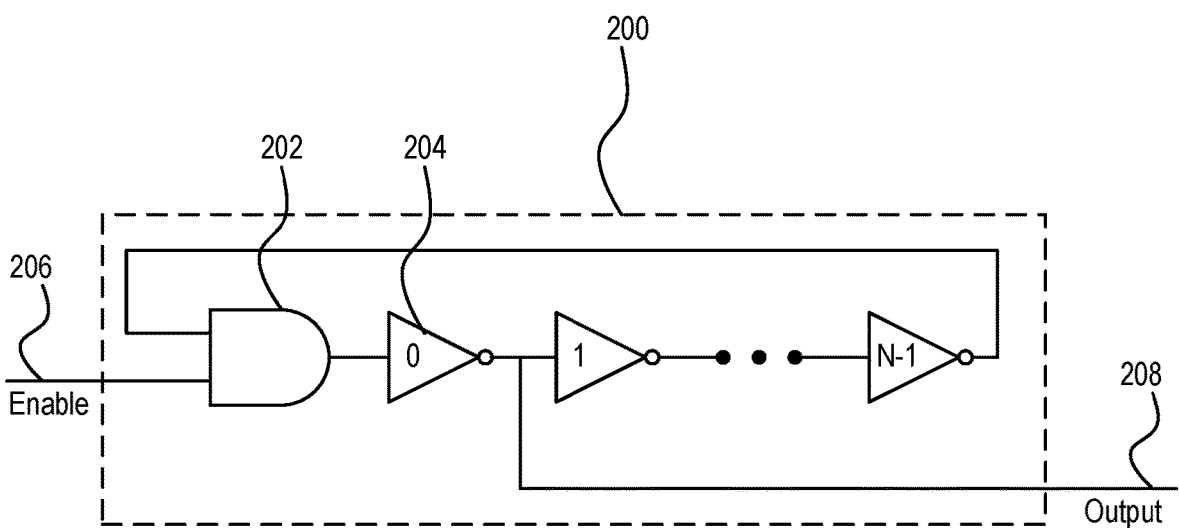
FIG. 2 shows an example ring oscillator for a fault-sensing ring oscillator circuit in accordance with embodiments of the present disclosure.

For further explanation, FIG. 2 sets forth an example ring oscillator 200 for a fault-sensing ring oscillator circuit in accordance with at least one embodiment of the present disclosure. The example ring oscillator includes a NAND gate 202 coupled to a chain of inverters 204 (also referred to as a NOT gate). The output of the NAND gate 202 is supplied as input to the chain of inverters 204. The chain of inverters 204 includes an odd-number of inverters such that the output signal is a logical NOT of the input. The output signal of the chain of inverters 204 is fed back as an input to the NAND gate 202. An enable signal 206 is also supplied as an input to the NAND gate 202. Thus, when the enable signal 206 is low, or logical 0, the ring oscillator also produces an output signal 208 that is low, or logical 0, and thus will not ring. In the example of FIG. 2, when the enable signal 206 is logical zero, the output of the NAND gate 202 is always logical 1. When the output signal 208 is the output of the first inverter in the chain of inverters 204 the output signal 208 of the ring oscillator 200 will be logical 0. When the enable signal 206 is high, the output signal 208 will toggle between logical 1 and logical 0. That is, when the enable signal 206 is high, the feedback from the final inverter in the chain of inverters 204 into the NAND gate 202 will cause the NAND gate to toggle, which causes the output signal 208 of the ring oscillator to toggle (i.e., oscillate). Although not shown, it should be understood that each gate is connected to a supply voltage (e.g., $V_{DD}$ and $V_{SS}$). Thus, operation of the ring oscillator draws a current. It will be recognized by those of skill in the art that each gate also functions as a delay, thus the frequency of the oscillation can be changed by the number of inverters in the chain or by increasing supply voltage. It will be recognized by those of skill in the art that a ring oscillator may be implemented through other combinations of gates.

Figure 3:
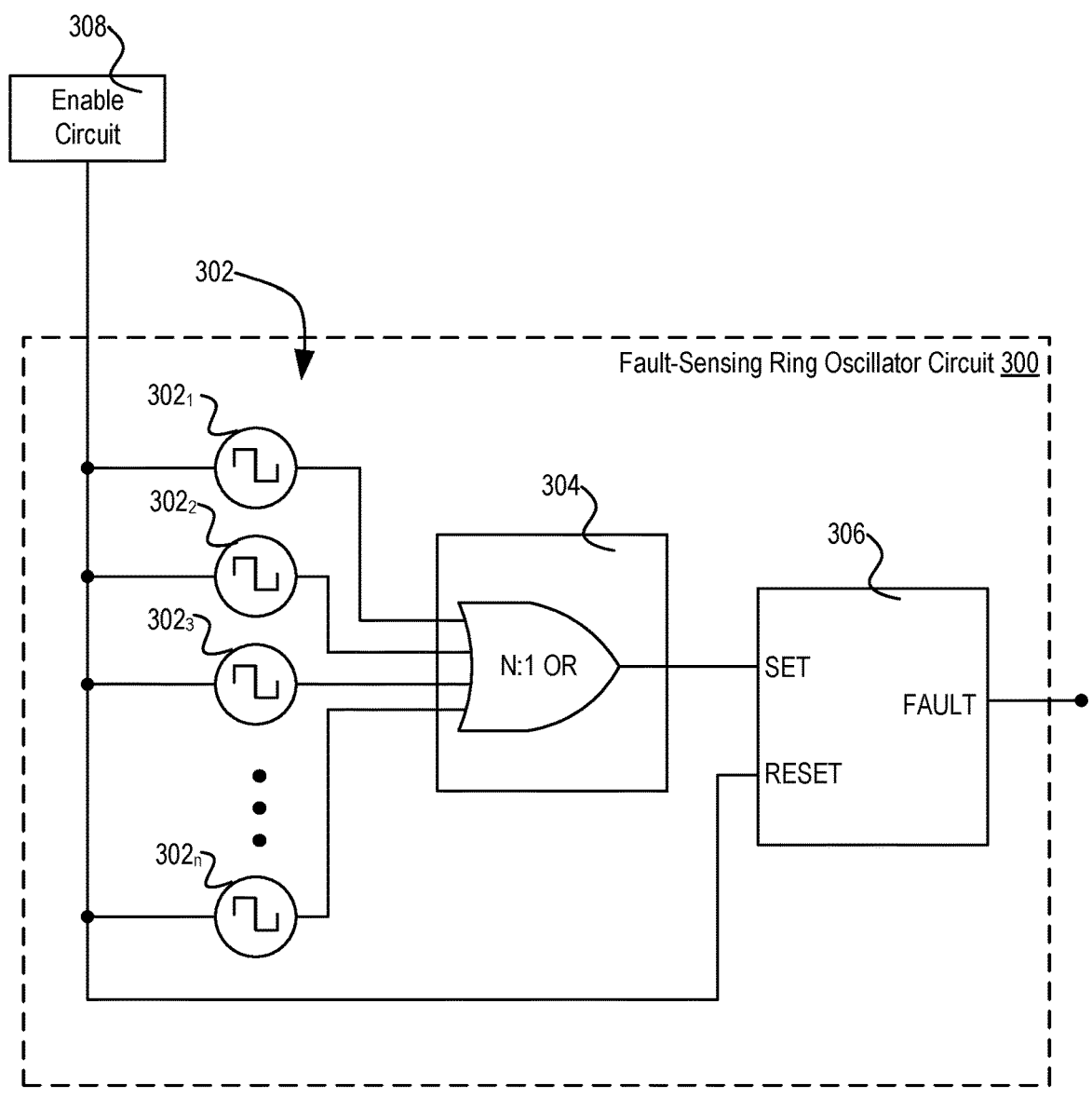
FIG. 3 shows an example fault-sensing ring oscillator circuit according to some embodiments of the present disclosure.

For further explanation, FIG. 3 sets forth an example fault-sensing ring oscillator circuit 300 in accordance with at least one embodiment of the present disclosure. The fault-sensing ring oscillator circuit 300 includes several ring oscillators $302_1$, $302_2$, $302_3$ ... $302_n$ (collectively referred to as ring oscillators 302). The ring oscillators 302 may be, for example, the ring oscillator 200 of FIG. 2. The ring oscillators 302 are all connected to an enable circuit 308 that provides an enable signal (e.g., the enable signal 206 of FIG. 2) to collectively enable and disable the ring oscillators 302. The fault-sensing ring oscillator circuit 300 also includes an OR circuit 304 coupled to the output of each ring oscillator 302. In some examples, the output of each ring oscillator 302 supplies an input to the OR circuit 304, where the OR circuit 304 generates a single output signal (thus, an N:1 OR). In other examples, the OR circuit 304 may generate more than one output signal. The OR circuit 304 outputs a known state for the collection of ring oscillator 302. For example, if none of the ring oscillators 302 are active, as should be the case when disabled by the enable signal, the output of the OR circuit 304 should always be logical 0. If one or more of the ring oscillators 302 are active (i.e., switching), the output of the OR circuit 304 will also toggle. Thus, the output of the OR circuit 304 may indicate that at least one ring oscillator 302 is active, which may indicate a stuck at fault condition if the ring oscillator 302 is active when the enable signal is low or de-asserted.

The fault-sensing ring oscillator circuit 300 also includes a fault detection latch 306 (e.g., a set-reset latch). In the example of FIG. 3, the SET input of the fault detection latch 306 is coupled to an output signal of the OR circuit 304. The RESET input of the fault detection latch 306 is coupled to the ring oscillator enable signal that is generated by the enable circuit 308. In some examples, the enable signal from the enable circuit 308 goes low to disable the ring oscillators 302. A low ring oscillator enable signal received at the RESET input allows the fault detection latch 306 to be SET by the output of the OR circuit 304. Under normal conditions, no ring oscillators will be active and thus the logical 0 output by the OR circuit 304 will not SET the fault detection latch 306. However, when at least one ring oscillator 302 is still active after the enable signal goes low, the fault detection latch 306 will latch a logical 1 output by the OR circuit 304. When the fault detection latch 306 is SET by the logical 1 output by the OR circuit, the logical 1 output by the fault detection latch 306 indicates a fault. That is, at least one ring oscillator is stuck at fault. Thus, when the FAULT output (i.e., the Q output) of the fault detection latch 306 outputs a logical 1, the ring oscillators are indicated to be stuck at fault.

Figure 4:
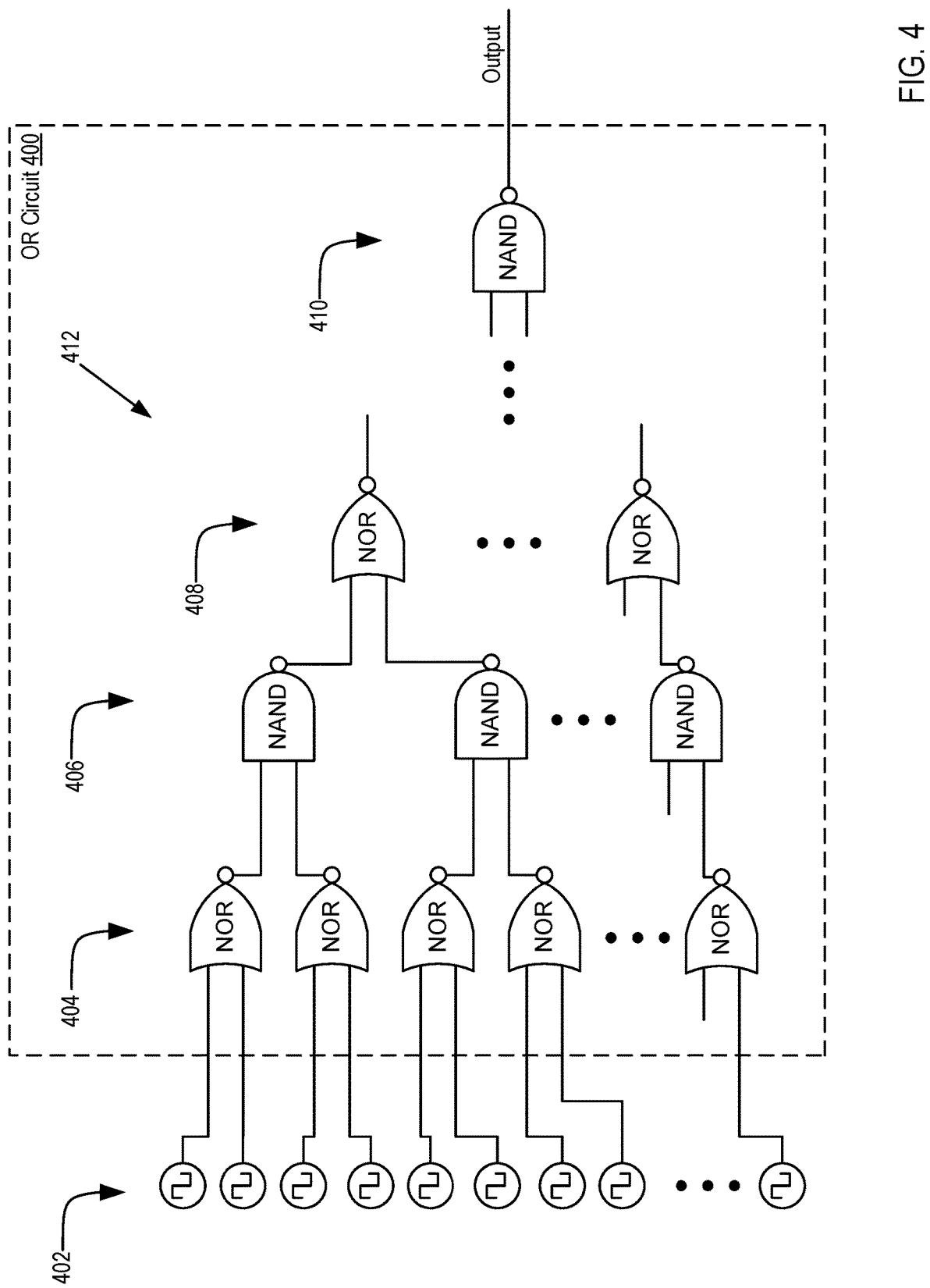
FIG. 4 shows another example fault-sensing ring oscillator circuit according to some embodiments of the present disclosure.

For further explanation, FIG. 4 sets forth an example implementation of an OR circuit 400 for a fault-sensing ring oscillator circuit in accordance with at least one embodiment of the present disclosure. The OR circuit 400 may be, for example, an implementation of the OR circuit 304 in FIG. 3. The OR circuit 400 includes a NOR-NAND tree 412 that includes alternating stages 404, 406, 408, 410 of NOR gates and NAND gates. The number of stages is a function of the number of oscillators and the number of inputs to each gate. In this example, each gate takes two inputs. However, in other implementations one or more of the gates in the NOR-NAND tree 412 may take more than two inputs. This may be necessary, for example, when the number of ring oscillators is an odd number.

In the example of FIG. 4, The first stage of the NOR-NAND tree 412 is a NOR stage 404 that includes a number of NOR gates equal to half the number of oscillators 402. Each NOR gate in the NOR gate stage 404 receives, as input, the output of two ring oscillators. The second stage of the NOR-NAND tree 412 is a NAND stage 406 that includes a number of NAND gates equal to half the number of NOR gates in the NOR stage 404. Each NAND gate in the NAND gate stage 406 receives, as input, the output of two NOR gates in the NOR stage 404. The third stage of the NOR-NAND tree 412 is a NOR stage 408 that includes a number of NOR gates equal to half the number of NAND gates in the NAND stage 406. Each NOR gate in the NOR gate stage 406 receives, as input, the output of two NAND gates in the NAND stage 406. The NOR-NAND tree 412 may continue alternating NOR-NAND stages, halving the number of gates from the previous stage, until one gate is left in the final stage 410. In the example of FIG. 4, the final stage 410 includes a single NAND gate. In different arrangements, the NOR-NAND tree 412 might end with a single NOR gate in the final stage. In such a case, an inverter may be added to the output of the final NOR gate.

The resolution of fault detection in the ring oscillators 402 may be increased by decreasing the number of stages. For example, in the example of FIG. 4, if the NOR gate stage 408 were the final stage, the OR circuit 400 would be configured with two outputs for detecting faults in subsets of the ring oscillators 402 (e.g., a first subset of ring oscillators $302_1$ to $302_j$ and a second subset of ring oscillators $302_k$ to $302_n$ among ring oscillators 302 in FIG. 3). The resolution can be further increased by further reducing stages in the NOR-NAND tree.

Figure 5A:
FIG. 5A shows an example operation of a fault-sensing ring oscillator circuit according to some embodiments of the present disclosure.
Figure 5B:
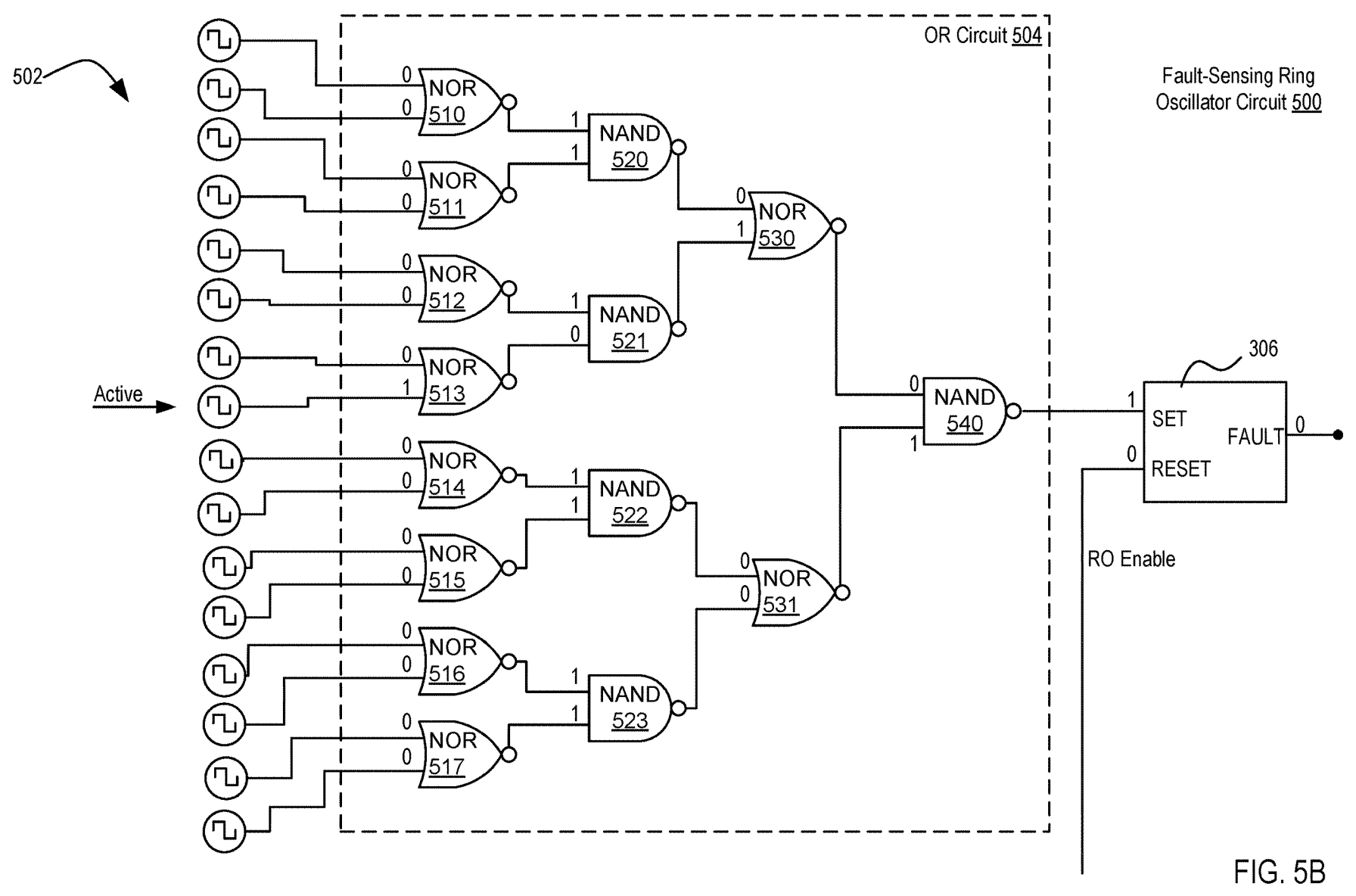

For further explanation, FIGS. 5A and 5B set forth an example operation of an example fault-sensing ring oscillator circuit 500 in accordance with at least one embodiment of the present disclosure. The example fault-sensing ring oscillator circuit 500 of FIGS. 5A and 5B may implement a NOR-NAND tree for the OR circuit as discussed above with reference to FIG. 4. The example of FIGS. 5A and 5B include sixteen ring oscillators 502. In the OR circuit 504, the first stage of the NOR-NAND tree includes eight NOR gates 510, 511, 512, 513, 514, 515, 516, 517, each taking the output of two of the ring oscillators 502 as input. The second stage of the NOR-NAND tree includes four NAND gates 520, 521, 522, 523, each taking the output of two NOR gates from the first stage as input. The third stage of the NOR-NAND tree includes two NOR gates 530, 531, each taking the output of two NAND gates from the second stage as input. The fourth state includes one NAND gate 540 taking the output of the two NOR gates in the third state as input. The output of the final NAND gate 540 is supplied to the SET input of the fault detection latch 306. The enable signal for the ring oscillators 502 is supplied to the RESET input of the fault detection latch 306.

FIG. 5A depicts the operation when a stuck at fault condition is not detected. When the enable signal goes low, all ring oscillators 302 are disabled and thus output a logical 0. As such, all inputs to all NOR gates in the first stage are logical 0 and the outputs of all NOR gates in the first stage are logical 1. It follows that all inputs to all NAND gates in the second stage are logical 1 and thus all outputs of all NAND gates in the second stage are logical 0. It further follows that all inputs to all NOR gates in the third stage are logical 0 and thus all outputs of all NOR gates in the third stage are logical 1. It further follows that both inputs of the final NAND gate in the fourth and final stage of the NOR-NAND tree are logical 1 and thus the output is logical 0. Accordingly, the SET input of the fault detection latch 306 receives a logical 0 and the reset input of the fault detection latch 306 receives a logical 0, and therefore the output of the fault detection latch 306 is logical 0 indicating no fault.

FIG. 5B depicts the operation when a stuck at fault condition is detected. When the enable signal goes low, at least one ring oscillator is still active and thus its output toggles between logical 0 and logical 1. As such, NOR gate 513 receives a logical 0 and a logical 1 as input. The logical 1 of the switching ring oscillator disrupts the expected state of the NOR gate 513, causing it to output a logical 0 instead of a logical 1. This disruption propagates through a NOR-NAND chain that includes NOR gate 513, NAND gate 521, NOR gate 530, and finally to NAND gate 540. Thus, the inputs to the final NAND gate 540 in the fourth and final stage of the NOR-NAND tree are logical 0 and logical 1 and thus the output is logical 1. Accordingly, the SET input of the fault detection latch 306 receives a logical 1 and the reset input of the fault detection latch 306 receives a logical 0, and therefore the output of the fault detection latch 306 is logical 1 indicating a fault.

Figure 6:
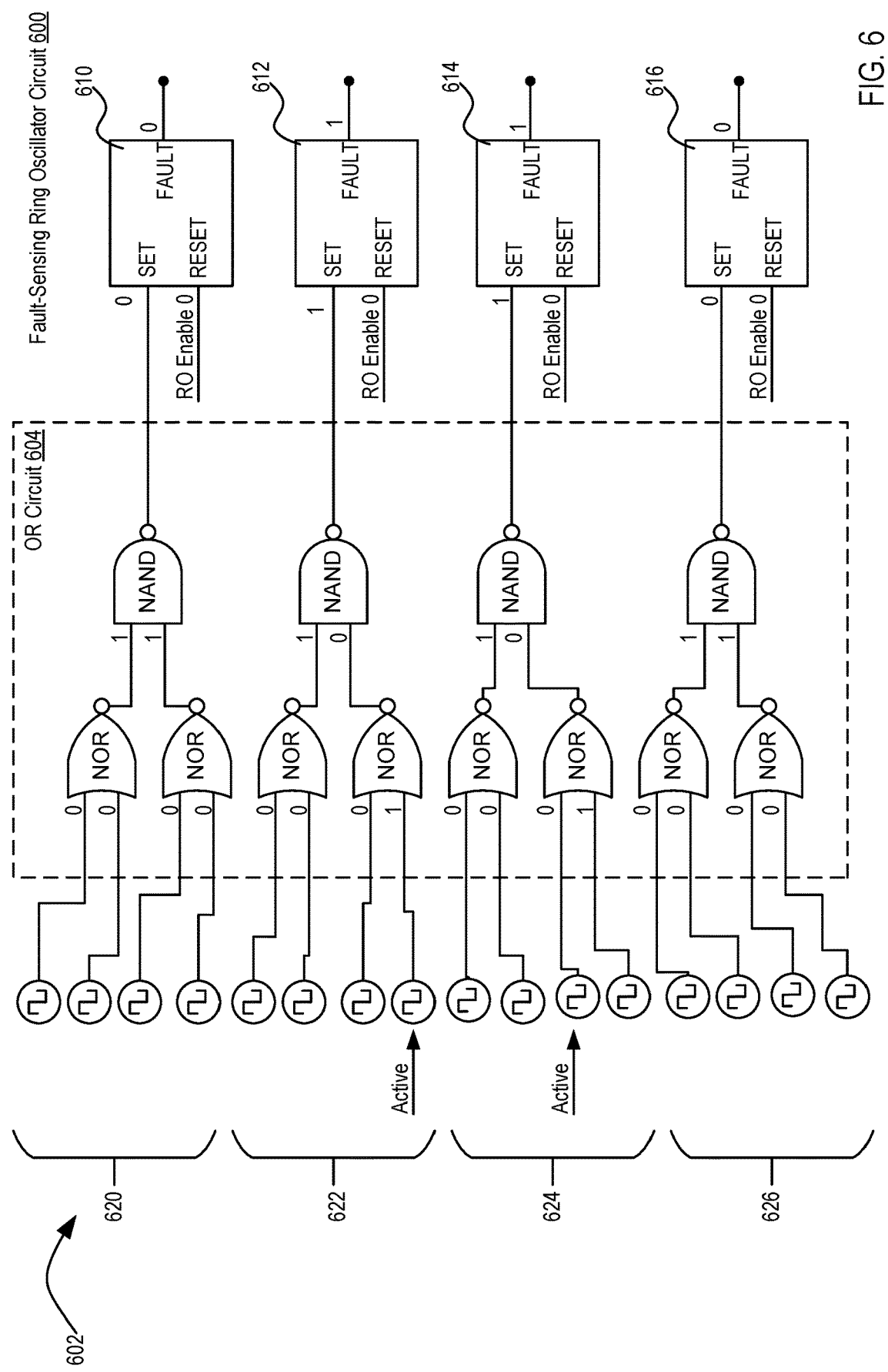
FIG. 6 shows another example fault-sensing ring oscillator circuit according to some embodiments of the present disclosure.

For further explanation, FIG. 6 sets forth an example fault-sensing ring oscillator circuit 600 in accordance with at least one embodiment of the present disclosure. The fault-sensing ring oscillator circuit 600 is similar to the fault-sensing ring oscillator circuit 500 of FIG. 5. However, in the example of FIG. 6, the number of stages of the NOR NAND tree has been reduced to two stages, one NOR stage including eight NOR gates and one NAND stage including four NAND gates. Accordingly, the OR circuit 604 outputs four distinct outputs. Each of the four outputs of the OR circuit 604 is supplied to the SET input of a respective fault detection latch 610, 612, 614, 616. This increases the resolution of the fault-sensing ring oscillator circuit 600 to detect faults in subsets 620, 622, 624, 626 of the ring oscillators 602. In the example of FIG. 6, one of the ring oscillators in the second subset 622 is active while the ring oscillator enable is low, and one of the ring oscillators in the third subset 624 is active while the ring oscillator enable is low. The logical 1 output by fault detection latch 612 indicates a stuck at fault condition in the second subset 622 of ring oscillators 602, while the logical 1 output by fault detection latch 614 indicates a stuck at fault condition in the third subset 624 of ring oscillators 602.

Figure 7:
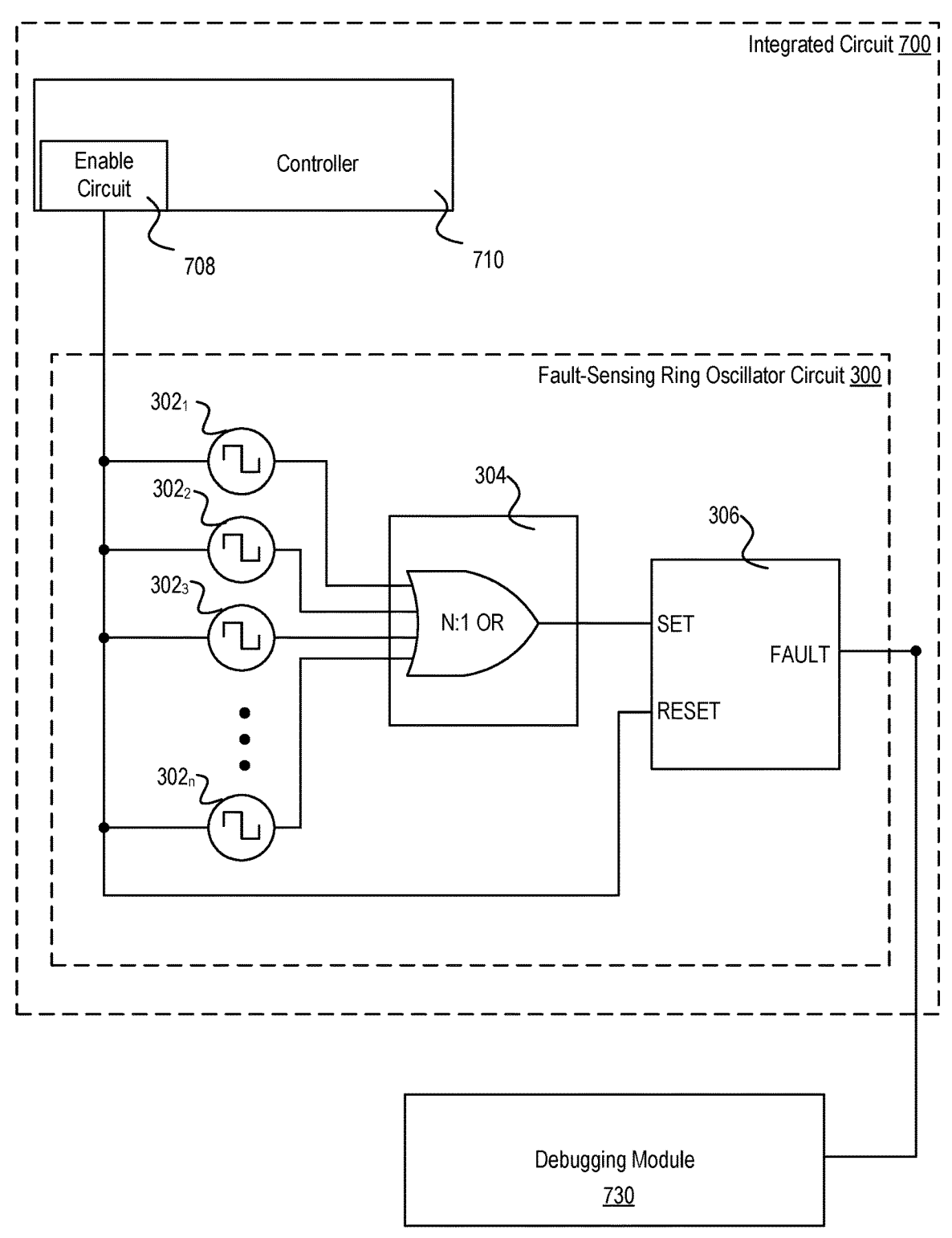
FIG. 7 shows an example integrated circuit employing a fault-sensing ring oscillator circuit according to some embodiments of the present disclosure.

For further explanation, FIG. 7 sets forth an example integrated circuit 700 including a fault-sensing ring oscillator circuit 300 in accordance with at least one embodiment of the present disclosure. The example integrated circuit 700 of FIG. 7 includes the fault-sensing ring oscillator circuit 300 of FIG. 3. The example of FIG. 7 also includes a power controller 710 that determines when to enable and disable the ring oscillators via the enable circuit 708. In some examples, the integrated circuit 700 is a chip such as a processor (e.g., the processor 110 of FIG. 1) and the power controller 710 controls voltage levels in the chip. For example, as the ring oscillators 302 are coupled to $V_{DD}$, the controller 710 may enable the ring oscillators to draw addition current to allow for $V_{MAX}$ relaxation. In one example, when running a light workload, ring oscillators 302 may be enabled to raise total current draw, thus lowering the voltage seen by the chip, and thus lowering power. In other implementations, the ring oscillators 302 may be used to reduce voltage drooping events in regions of the chip, thus compressing the overall prow profile experienced by those regions and reducing voltage noise. Given such uses for ring oscillator circuits, it will be appreciated that it is important to know if a stuck ring oscillator is contributing to the power profile of the chip. That is, when characterizing the power on the chip, it is important to determine which components are consuming power. For example, most of the power on a chip may be focused on $V_{DD}$ and so all circuits that participate in $V_{DD}$ may benefit having extra power to protect from $V_{MAX}$. Thus, the fault sensing ring oscillator circuit in accordance with embodiments of the present disclosure provides design confidence when characterizing power profile by ruling out the ring oscillator circuit as an unexpected source of current draw without probing each ring oscillator to determine whether one is stuck at fault.

In some examples, the output of the fault detection latch 306 is read by a debugging module 730. The debugging module 730 may be circuitry or a debugging application configured to read the state of the fault detection latch 306 and determine, based on the state of the fault detection latch 306, whether the integrated circuit 700 includes one or more ring oscillators that are stuck at fault. In some examples, the debugging module 730 is configured to generate an output or otherwise indicate to a tester that one or more ring oscillators are stuck at fault.

For further explanation, FIG. 8 sets forth a flow chart of an example method for a fault-sensing ring oscillator circuit in accordance with at least one embodiment of the present disclosure. The method includes providing 802 a fault-sensing ring oscillator circuit, the fault-sensing ring oscillator circuit including: a plurality of ring oscillators; an enable circuit configured to enable and disable the plurality of ring oscillators; an OR circuit including a plurality of inputs, wherein each input is coupled to a respective ring oscillator of the plurality of ring oscillators; and a fault detection latch including a SET input coupled to an output of the OR circuit and a RESET input coupled to the enable circuit. In some examples, providing 802 a fault-sensing ring oscillator circuit is carried out by including the fault-sensing ring oscillator circuit in the design of an integrated circuit.

Examples of such a fault-sensing ring oscillator circuit are described above with reference to FIGS. 2-7.

The method of FIG. 8 also includes detecting 804 a stuck at fault condition indicated by the fault detection latch when the plurality of ring oscillators are disabled by the enable circuit and at least one of the plurality of ring oscillators is active. In some examples, detecting 804 the stuck at fault condition is carried out by reading the output of the fault detection latch. For example, the output may be read through a probe, a test port, a lead on the integrated circuit, and so on.

In view of the explanations set forth above, readers will recognize that the benefits of configuring a fault-sensing ring oscillator circuit according to embodiments of the present disclosure include:

Easily and quickly detecting when one or more ring oscillators are stuck at fault.

Facilitating power characterization of an integrated circuit by improving design confidence.

Exemplary embodiments of the present disclosure are described largely in the context of a fully functional computer system for optimizing network load in multicast communications. Readers of skill in the art will recognize, however, that the present disclosure also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. A fault-sensing ring oscillator circuit comprising:
a plurality of ring oscillators;
an enable circuit configured to enable and disable the plurality of ring oscillators;
an OR circuit including a plurality of inputs, wherein each input is coupled to a respective ring oscillator of the plurality of ring oscillators; and
a first fault detection latch including a SET input coupled to a first output of the OR circuit and a RESET input coupled to the enable circuit,
wherein the first fault detection latch indicates a stuck at fault condition when the plurality of ring oscillators are disabled by the enable circuit and at least one of the plurality of ring oscillators is active.

2. The fault-sensing ring oscillator circuit of claim 1, wherein the first output of the OR circuit indicates logical 1 when at least one of the plurality of ring oscillators is active, and wherein the first fault detection latch is set by the first output of the OR circuit indicating logical 1.

3. The fault-sensing ring oscillator circuit of claim 2, wherein the first fault detection latch outputs logical 1 when set, and wherein a stuck at fault condition is indicated when the first fault detection latch outputs logical 1.

4. The fault-sensing ring oscillator circuit of claim 3, wherein the first fault detection latch is reset when the enable circuit disables the plurality of ring oscillators.

5. The fault-sensing ring oscillator circuit of claim 1, wherein the OR circuit includes a NOR-NAND tree coupled to the plurality of ring oscillators, the NOR-NAND tree including alternating stages of NOR gates and NAND gates, wherein a final stage of the NOR-NAND tree includes a single gate that provides the first output of the OR circuit.

6. The fault-sensing ring oscillator circuit of claim 1, wherein the OR circuit includes a NOR-NAND tree coupled to the plurality of ring oscillators, the NOR-NAND tree including alternating stages of NOR gates and NAND gates, wherein a final stage of the NOR-NAND tree includes at least two gates,
wherein a first gate of the at least two gates provides the first output of the OR circuit to indicate a fault in a first subset of the plurality of ring oscillators,
wherein a second gate of the at least two gates provides a second output of the OR circuit to indicate a fault in a second subset of the plurality of ring oscillators, and
wherein the second output of the OR circuit is coupled to a second fault detection latch.

7. The fault-sensing ring oscillator circuit of claim 1, wherein the plurality of ring oscillators is coupled to a voltage regulation circuit, and wherein the voltage regulation circuit includes the enable circuit.

8. An integrated circuit including a fault-sensing ring oscillator circuit, the integrated circuit comprising:
a power controller;
a plurality of ring oscillators, wherein the plurality of ring oscillators are enabled and disabled by an enable circuit of the power controller;
an OR circuit including a plurality of inputs, wherein each input is coupled to a respective ring oscillator of the plurality of ring oscillators; and
a first fault detection latch including a SET input coupled to a first output of the OR circuit and a RESET input coupled to the enable circuit,
wherein the first fault detection latch indicates a stuck at fault condition when the plurality of ring oscillators are disabled by the enable circuit and at least one of the plurality of ring oscillators is active.

9. The integrated circuit of claim 8, wherein the first output of the OR circuit indicates logical 1 when at least one of the plurality of ring oscillators is active, and wherein the first fault detection latch is set by the first output of the OR circuit indicating logical 1.

10. The integrated circuit of claim 9, wherein the first fault detection latch outputs logical 1 when set, and wherein a stuck at fault condition is indicated when the first fault detection latch outputs logical 1.

11. The integrated circuit of claim 10, wherein the first fault detection latch is reset when the enable circuit disables the plurality of ring oscillators.

12. The integrated circuit of claim 8, wherein the OR circuit includes a NOR-NAND tree coupled to the plurality of ring oscillators, the NOR-NAND tree including alternating stages of NOR gates and NAND gates, wherein a final stage of the NOR-NAND tree includes a single gate that provides the first output of the OR circuit.

13. The integrated circuit of claim 8, wherein the OR circuit includes a NOR-NAND tree coupled to the plurality of ring oscillators, the NOR-NAND tree including alternating stages of NOR gates and NAND gates, wherein a final stage of the NOR-NAND tree includes at least two gates, wherein a first gate of the at least two gates provides the first output of the OR circuit to indicate a fault in a first subset of the plurality of ring oscillators, wherein a second gate of the at least two gates provides a second output of the OR circuit to indicate a fault in a second subset of the plurality of ring oscillators, and wherein the second output of the OR circuit is coupled to a second fault detection latch.

14. The integrated circuit of claim 8, wherein the power controller enables the plurality of ring oscillators such that a maximum voltage of the integrated circuit is reduced.

15. A method of a fault-sensing ring oscillator circuit, the method comprising:

providing a fault-sensing ring oscillator circuit, the fault-sensing ring oscillator circuit including:

a plurality of ring oscillators;

an enable circuit configured to enable and disable the plurality of ring oscillators;

an OR circuit including a plurality of inputs, wherein each input is coupled to a respective ring oscillator of the plurality of ring oscillators; and a fault detection latch including a SET input coupled to an output of the OR circuit and a RESET input coupled to the enable circuit; and detecting a stuck at fault condition indicated by the fault detection latch when the plurality of ring oscillators are disabled by the enable circuit and at least one of the plurality of ring oscillators is active.

16. The method of claim 15, wherein the output of the OR circuit indicates logical 1 when at least one of the plurality of ring oscillators is active, and wherein the fault detection latch is set by the output of the OR circuit indicating logical 1.

17. The method of claim 16, wherein the fault detection latch outputs logical 1 when set, and wherein a stuck at fault condition is indicated when the fault detection latch outputs logical 1.

18. The method of claim 17, wherein the fault detection latch is reset when the enable circuit disables the plurality of ring oscillators.

19. The method of claim 15, wherein the OR circuit includes a NOR-NAND tree coupled to the plurality of ring oscillators, the NOR-NAND tree including alternating stages of NOR gates and NAND gates, wherein a final stage of the NOR-NAND tree includes a single gate that provides the output of the OR circuit.

20. The method of claim 15 further comprising:

enabling, by a voltage regulation circuit, the plurality of ring oscillators such that a maximum voltage is controlled through the plurality of ring oscillators.

* * * * *